(12) United States Patent
Iwasaki

(10) Patent No.: US 6,338,104 B1
(45) Date of Patent: Jan. 8, 2002

(54) SYSTEM INCLUDING SINGLE CONNECTOR PIN SUPPORTER HAVING TWO SEPARATE PLURALITY OF CONNECTOR PINS WITH ONE SET OF PINS CONTACTING STATE DESIGNATING PORTION OF MEMORY CARD INDICATING WRITE PROHIBIT STATE

(75) Inventor: Hiroshi Iwasaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/658,189

(22) Filed: Sep. 8, 2000

Related U.S. Application Data

(62) Division of application No. 09/372,678, filed on Aug. 12, 1999, now Pat. No. 6,292,850, which is a division of application No. 09/143,739, filed on Aug. 28, 1998, now Pat. No. 6,094,697, which is a division of application No. 08/592,508, filed on Jan. 26, 1996, now Pat. No. 6,145,023.

(30) Foreign Application Priority Data

Feb. 3, 1995 (JP) ............................................. 7-017185

(51) Int. Cl.[7] .......................... G06F 13/14; G06F 13/16
(52) U.S. Cl. ........................ 710/36; 710/37; 711/100; 386/125; 360/133; 439/74; 439/83; 439/876; 439/540.1
(58) Field of Search ................... 386/125; 360/133; 439/74, 83, 876, 540.1; 710/36, 37; 711/100

(56) References Cited

U.S. PATENT DOCUMENTS

| | | |
|---|---|---|
| 4,264,917 A | 4/1981 | Ugon |
| 4,703,420 A | 10/1987 | Irwin |
| 4,837,628 A | 6/1989 | Sasaki |
| 4,860,127 A | 8/1989 | Takahashi et al. |
| 4,860,142 A | 8/1989 | DiGiesi |
| 4,882,702 A | 11/1989 | Struger et al. |
| 4,916,662 A | 4/1990 | Mizuta |
| 4,943,464 A | 7/1990 | Gloton et al. |
| 4,980,856 A | 12/1990 | Ueno |
| 5,018,017 A | 5/1991 | Sasaki et al. |
| 5,036,429 A | 7/1991 | Kaneda et al. |
| 5,153,818 A | 10/1992 | Mukougawa et al. |
| 5,172,338 A | 12/1992 | Mehrotra et al. |
| 5,184,282 A | 2/1993 | Kaneda et al. |
| 5,210,671 A | 5/1993 | Blackston |
| 5,226,006 A | 7/1993 | Wang et al. |
| 5,267,218 A | 11/1993 | Elbert |
| 5,272,374 A | 12/1993 | Kodai et al. |

(List continued on next page.)

FOREIGN PATENT DOCUMENTS

| | | |
|---|---|---|
| EP | 0 214 478 | 3/1987 |
| GB | 818554 | 8/1959 |
| GB | 2 208 029 A | 2/1989 |
| JP | 64-55691 | 3/1990 |
| JP | 4-16396 | 1/1992 |

OTHER PUBLICATIONS

European Patent Office Publication, Patent Abstracts of Japan, Publication No. 63137387, dated Jun. 9, 1988.

*Primary Examiner*—Thomas Lee
*Assistant Examiner*—Rehana Perveen
(74) *Attorney, Agent, or Firm*—Finnegan, Henderson, Farabow, Garrett & Dunner, L.L.P.

(57) ABSTRACT

In a small and thin memory module for sharing data among electronic devices such as information processing apparatuses, a write prohibit state can be visually recognized. A conductive seal is attached to a predetermined position on a support member, thereby setting the memory module in the write prohibit state. The conductive seal visually indicates the write prohibit state. When the memory module is mounted in a connector section of a card-shaped holder, connector pins are electrically connected to each other via the conductive seal. Thus, a write prohibit mechanism is realized at low cost.

13 Claims, 4 Drawing Sheets

U.S. PATENT DOCUMENTS

| | | | |
|---|---|---|---|
| 5,293,236 A | 3/1994 | Adachi et al. | |
| 5,297,029 A | 3/1994 | Nakai et al. | |
| 5,297,148 A | 3/1994 | Harari et al. | |
| 5,299,089 A | 3/1994 | Lwee | |
| 5,343,319 A | 8/1994 | Moore | |
| 5,349,685 A | 9/1994 | Houlberg | |
| 5,375,037 A | 12/1994 | Le Roux | |
| 5,387,111 A * | 2/1995 | DeSantis et al. | 439/65 |
| 5,388,084 A | 2/1995 | Itoh et al. | |
| 5,430,859 A | 7/1995 | Norman et al. | |
| 5,438,359 A | 8/1995 | Aoki | |
| 5,457,590 A | 10/1995 | Barrett et al. | |
| 5,469,399 A | 11/1995 | Sato et al. | |
| 5,475,441 A | 12/1995 | Parulski et al. | |
| 5,488,433 A | 1/1996 | Washino et al. | |
| 5,508,971 A | 4/1996 | Cernea et al. | |
| 5,509,018 A | 4/1996 | Niijima et al. | |
| 5,535,328 A | 7/1996 | Harari et al. | |
| 5,539,600 A | 7/1996 | Lee et al. | |
| 5,550,709 A | 8/1996 | Iwasaki | |
| 5,559,993 A | 9/1996 | Elliott et al. | |
| 5,563,825 A | 10/1996 | Cernea et al. | |
| 5,566,105 A | 10/1996 | Tanaka et al. | |
| 5,568,424 A | 10/1996 | Cernea et al. | |
| 5,572,466 A | 11/1996 | Sukegawa | |
| 5,572,478 A | 11/1996 | Sato et al. | |
| 5,584,043 A | 12/1996 | Burkart | |
| 5,592,420 A | 1/1997 | Cernea et al. | |
| 5,596,532 A | 1/1997 | Cernea et al. | |
| 5,602,987 A | 2/1997 | Harari et al. | |
| 5,608,673 A | 3/1997 | Rhee | |
| 5,611,057 A | 3/1997 | Pecone et al. | |
| 5,615,344 A | 3/1997 | Corder | |
| 5,621,685 A | 4/1997 | Cernea et al. | |
| 5,638,321 A | 6/1997 | Lee et al. | |
| 5,663,901 A | 9/1997 | Cernea et al. | |
| 5,671,229 A | 9/1997 | Harari et al. | |
| 5,675,833 A | 10/1997 | Radko et al. | 395/837 |
| 5,693,570 A | 12/1997 | Cernea et al. | |
| 5,727,005 A | 3/1998 | Le et al. | |
| 5,857,059 A | 1/1999 | Yamagishi | 386/125 |
| 5,887,145 A | 3/1999 | Harari et al. | |

\* cited by examiner

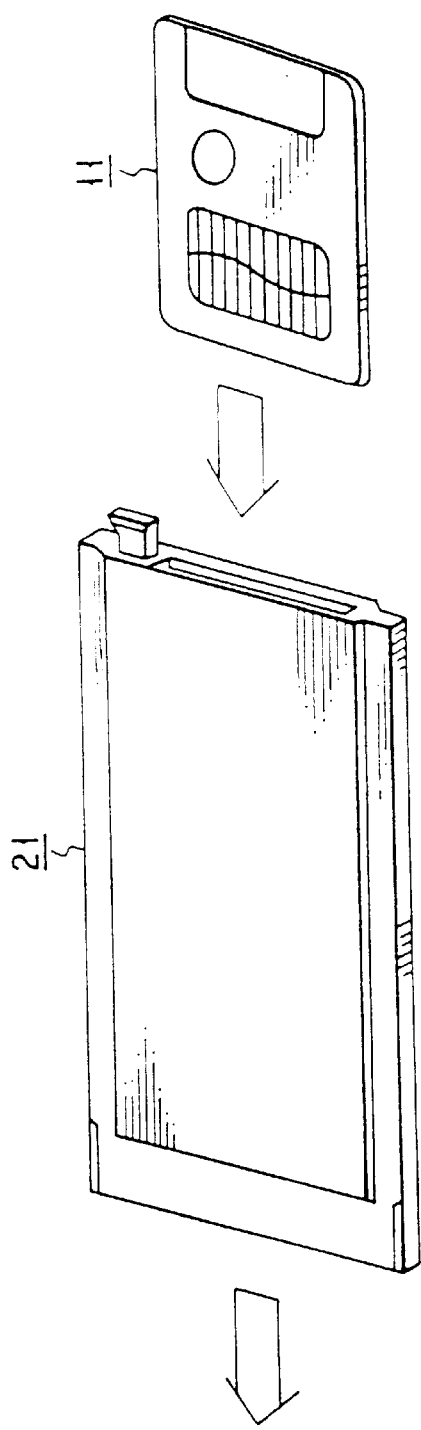
F I G. 3
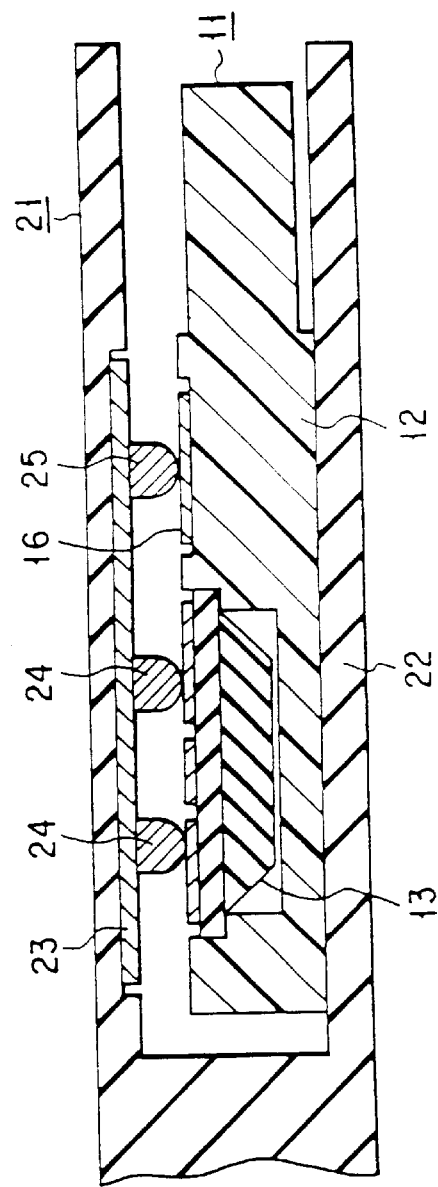
F I G. 4

SYSTEM INCLUDING SINGLE CONNECTOR PIN SUPPORTER HAVING TWO SEPARATE PLURALITY OF CONNECTOR PINS WITH ONE SET OF PINS CONTACTING STATE DESIGNATING PORTION OF MEMORY CARD INDICATING WRITE PROHIBIT STATE

This is a divisional application of application Ser. No. 09/372,678, filed Aug. 12. 1999, (now U.S. Pat. No. 6,292, 850) which is a divisional application of application Ser. No. 09/143,739 filed Aug. 28, 1998 (now U.S. Pat. No. 6,094, 697) which is a divisional application of application Ser. No. 08/592,508, filed Jan. 26, 1996, (now U.S. Pat. No. 6,145, 023) which application is entirely incorporated herein by reference.

Background of the Invention

1. Field of the Invention

The present invention relates generally to an information storage apparatus for sharing data among electronic devices such as information processing devices and an information processing apparatus using the information storage apparatus, and more particularly to a write prohibit mechanism for protecting internal data in an external storage apparatus.

2. Description of the Related Art

In a conventional method of sharing data among information processing devices, an attachable/detachable external storage apparatus in which data can be written is generally used. This type of external storage apparatus is normally provided with a write prohibit mechanism for protecting precious internal storage data from being erroneously erased.

In a typical write prohibit mechanism, for example, as used in a magnetic tape or a floppy disk, the shape of a portion of a casing of the external storage apparatus is made changeable and the change in shape is optically or mechanically detected on the information processing device side.

FIGS. 5A and 5B illustrate an example of the conventional write prohibit mechanism which is employed, for example, in a 3.5 inch floppy disk.

A floppy disk 1 has, in proper places, a sliding shutter 2 for data write/read, a bearing unit 3 for rotating a built-in magnetic disk, a label attachment section 4 on which a label indicating a title, etc. is attached, and a write protect tab 5. As is shown in FIGS. 5A and 5B, the write protect tab 5 comprises a slider 5a and an opening window 5b which is closed and opened in accordance the movement of the slider 5a.

Specifically, in the write prohibit mechanism using the write protect tab 5, the two shapes of the window 5b, i.e. the open shape and closed shape, which is determined by the movement of the slider 5a, are detected by means of a contact switch, etc. Thus, the write permit state and the write prohibit state can be discriminated on the information processing device side.

In another data write prohibit mechanism, an electric write path is cut off by a microswitch, as in a memory card in which data write is electrically effected.

In the write prohibit mechanisms, a change in physical shape is made mechanically. Therefore, there is an advantage in that the write permit state or write prohibit state can be recognized by the eye.

In each mechanism, however, the external storage apparatus needs to have certain dimensions and thickness.

On the other hand, there is a method in which a write prohibit state is stored as internal data in an external storage apparatus. Advantageously, this method can be applied to any type of external storage apparatus, irrespective of the size and thickness thereof.

In this method, however, the write permit state or write prohibit state cannot be recognized until the external storage apparatus is mounted in an information processing device and actually operated.

As has been described above, in the prior art, the external storage apparatus needs to have certain dimensions and thickness in order that one can recognize the write prohibit state.

SUMMARY OF THE INVENTION

The object of the invention is to provide a small and thin information storage apparatus permitting one to visually recognize the write prohibit state thereof and making it possible to realize a write prohibit mechanism at low cost and an information processing apparatus using this information storage apparatus.

In order to achieve the above object, according to the present invention, there is provided an information storage apparatus comprising:

storage medium means in which information can be written;

a support member incorporating the storage medium means; and a state-indicating conductive member provided on a surface of the supporting member, indicating a state of the storage medium means in which writing of information to the storage medium means is prohibited.

The storage medium means comprises a storage medium device including at least one non-volatile semiconductor memory device.

The support member has a recess in which the state-indicating conductive member is provided.

The support member is of non-conductive, and the state-indicating conductive member is of conductive to indicate the information write prohibit state of the storage medium means.

According to the present invention, there is by further provided an information storage apparatus comprising:

storage medium means in which information can be written;

a support member incorporating the storage medium means; and a state-indicating non-conductive member provided on a surface of the supporting member, indicating a state of the storage medium means in which writing of information to the storage medium means is prohibited.

The storage medium means comprises a storage medium device including at least one non-volatile semiconductor memory device.

The support member has a recess in which the state-indicating non-conductive member is provided.

The support member is of conductive, and the state-indicating non-conductive member is of non-conductive to indicate the information write prohibit state of the storage medium means.

The state-indicating non-conductive member is a seal.

According to the present invention, there is still further provided an information processing apparatus comprising:

an information storage device wherein information writable storage medium means is incorporated in a support member and a state-indicating conductive member is visibly provided, the state-indicating conductive members indicating a state of the storage medium means in which writing of information to the storage medium means is prohibited; and a processing device for receiving the information storage device, the processing device having discriminating means for detecting the conductivity of the state-indicating conductive member to discriminate the prohibit state of writing information to the storage medium means.

The storage medium means comprises a storage medium device including at least one non-volatile semiconductor memory device.

The support member has a recess in which the state-indicating conductive member is provided.

The state-indicating conductive member is a seal.

The discriminating means discriminates the prohibit state of writing information to the storage medium means by detecting the conductive state of the state-indicating conductive member.

The discriminating means discriminates the prohibit state of writing information to the storage medium means by bringing two or more connection pins into contact with the state-indicating conductive member and detecting the conductivity of the state-indicating conductive member.

The processing device is a processing device including a driving mechanism for driving the information storage device.

The processing device includes a card-shaped holder detachably attached to the processing device and including a driving mechanism for driving the information storage device incorporated in the card-shaped holder.

According to the present invention, there is yet further provided an information processing apparatus comprising:

an information storage device wherein information writable storage medium means is incorporated in a support member and a state-indicating non-conductive member is visibly provided, the state-indicating non-conductive member indicating a state of the storage medium means in which writing of information to the storage medium means is prohibited; and a processing device for receiving the information storage device, the processing device having discriminating means for detecting the non-conductivity of the state-indicating non-conductive member to discriminate the prohibit state of writing information to the storage medium means.

The storage medium means comprises a storage medium device including at least one non-volatile semiconductor memory device.

The support member has a recess in which the state-indicating non-conductive member is provided.

The state-indicating non-conductive member is a seal.

The discriminating means discriminates the prohibit state of writing information to the storage medium means by detecting the non-conductive state of the state-indicating non-conductive member.

The discriminating means discriminates the prohibit state of writing information to the storage medium means by bringing two or more connection pins into contact with-the state-indicating non-conductive member and detecting the non-conductivity of the state-indicating non-conductive member.

The processing device is a processing device including a driving mechanism for driving the information storage device.

The processing device includes a card-shaped holder detachably attached to the processing device and including a driving mechanism for driving the information storage device incorporated in the card-shaped holder.

In this invention, by virtue of the above-described structures, the write prohibit state can be discriminated on the basis of the change in electrical state and can also be recognized visually, even with use of a small and thin information storage apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention FIG 1A schematically shows a plan pattern of a memory module according to an embodiment of the invention;

FIG. 3 illustrates a case where a memory module is inserted in a card-shaped holder prepared separately from an electronic device and the holder is mounted in the electronic device;

FIG. 4 is a cross-sectional view schematically showing the structure of a main part of the card-shaped holder.

DETAILED DESCRIPTION OF THE PREFERRED EMBODIMENTS

An embodiment of the present invention will now be described with reference to the accompanying drawings.

Figure 1A:
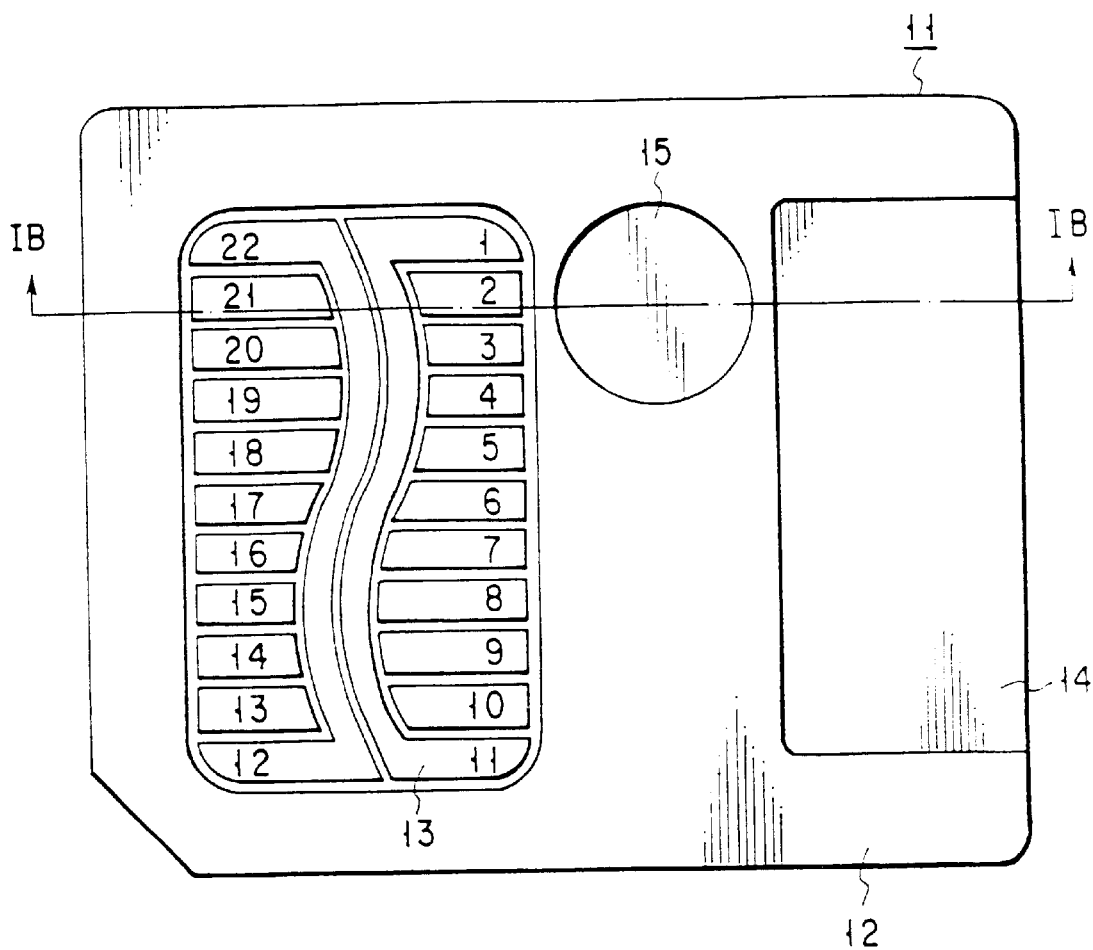
FIG. 1B a cross-sectional view taken along line IB—IB in FIG. 1A.
Figure 1B:
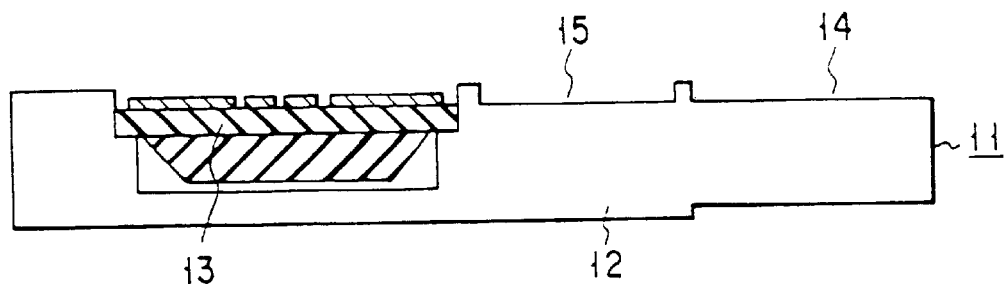

FIGS. 1A and 1B schematically show the structure of a memory module 11 of the present invention. FIG. 1A is a plan view of the memory module 11, and FIG. 1B is a cross-sectional view taken along line IB—IB in FIG. 1A.

The memory module 11 is used as an external storage apparatus such as a floppy disk. A semiconductor memory package 13 (described later in detail) serving as storage medium is mounted in a small card-shaped support member 12 formed of, e.g. plastic material.

The support member 12 has a label attachment section 14 on which an indication label for indicating an index of data stored in the semiconductor memory package 13, and a seal attachment section 15 on which a conductive seal serving as means for prohibiting inadvertent data write in the semiconductor memory package 13.

The size of the support member 12 is, for example, 37 mm×45 mm (less than half the size specified in ISO7813) and the thickness thereof is 0.76 mm±0.08 mm specified in ISO7813.

In the present embodiment, the size of the memory module 11 is set to be less than half the size specified in ISO7813 so that it can be used as floppy disk.

One corner of the support member 12, for example, one corner of a side to be inserted into a drive apparatus, is cut out. Thereby, reverse insertion into the drive apparatus is prevented.

The cut-out portion serves not only as means for preventing reverse insertion but also as limiting the use of the memory module 11. For example, if the semiconductor memory package 13 operable at 5 V and the semiconductor memory package 13 operable at 3.3 V are prepared, the former alone may be provided with the cut-out corner portion. Thus, the insertion of the memory package 13 operable at 3.3 V into the drive apparatus can be prevented, and the memory chip within the memory module 11 can be protected against electric destruction due to a variation in power voltage.

The label attachment section 14 has a recess with a depth corresponding to the thickness of a label to be attached. The label attachment section 14 extends from the upper surface to the lower surface so as to cover one side edge of the support member 12.

The seal attachment section 15 has a circular recess with a diameter of, e.g. 10 mm. The seal attachment section 15 indicates an attachment position of a conductive seal and prevents the conductive seal from projecting upwards from the upper surface of the support member 12, thereby maintaining the flatness of the surface of the memory module 11. Thus, when the memory module 11 is pulled out from or inserted into the drive apparatus, the seal is prevented from being peeled off or scratched.

The conductive seal functions as write protector for constituting a write prohibit mechanism. The conductive seal is formed inexpensively, for example, by coating an adhesive on one surface of paper sheet and coating a conductive material such as aluminum on the other surface thereof. The conductive seal has a circular shape with a diameter of, e.g. 8 mm so that it can be attached within the seal attachment section 15 on the support member 12.

Specifically, the conductive seal is attached on the seal attachment section 15 on the support member 12, thereby visually indicating that data write in the semiconductor memory package 13 is prohibited.

In addition, the write prohibit mechanism is easily achieved since the data write prohibit state can be automatically recognized on the basis of the conductive state effected by the conductive seal.

Figure 2A:
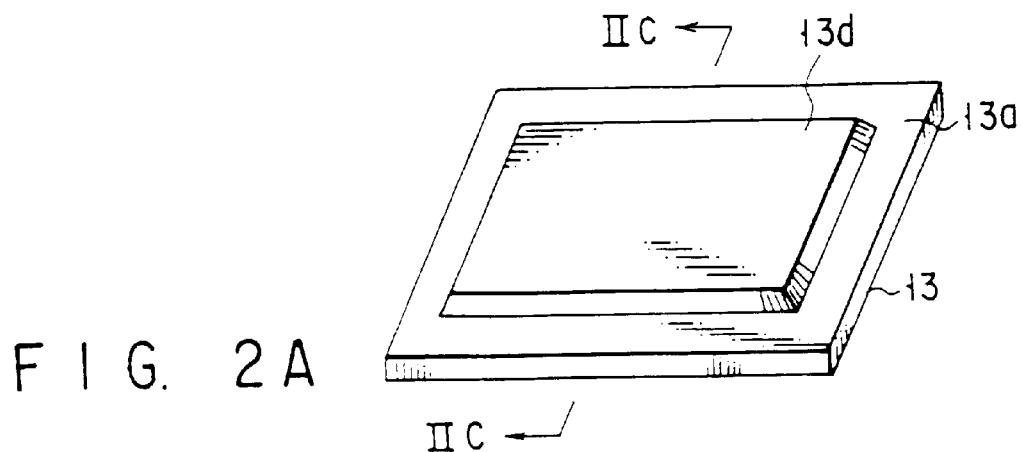
FIG. 2A is a perspective view of the sealed surface side of a semiconductor memory package built in a memory module FIG. 2B a perspective view of the terminal surface side of the memory package shown in FIG. 2A.
Figure 2B:
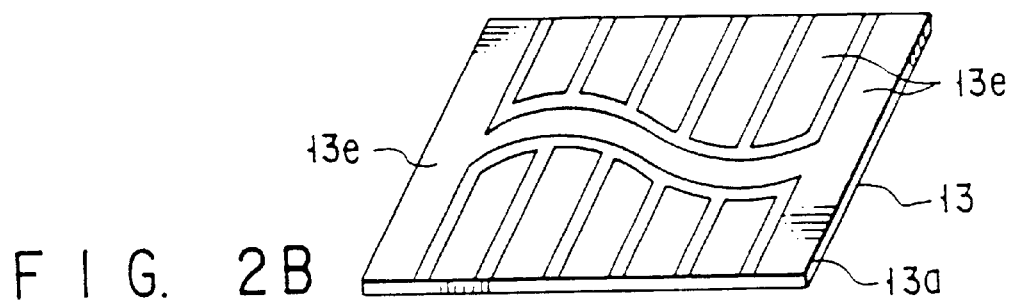
FIG. 2C is a cross-sectional view taken along line IIC—IIC FIG. 2A.
Figure 2C:
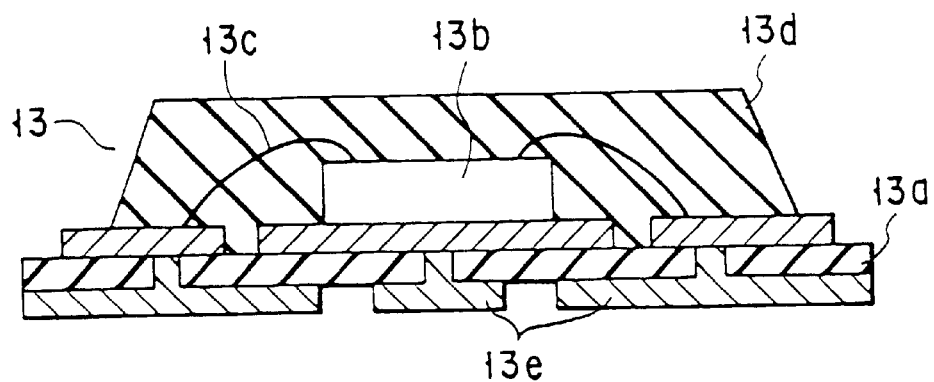
Figure 5A:
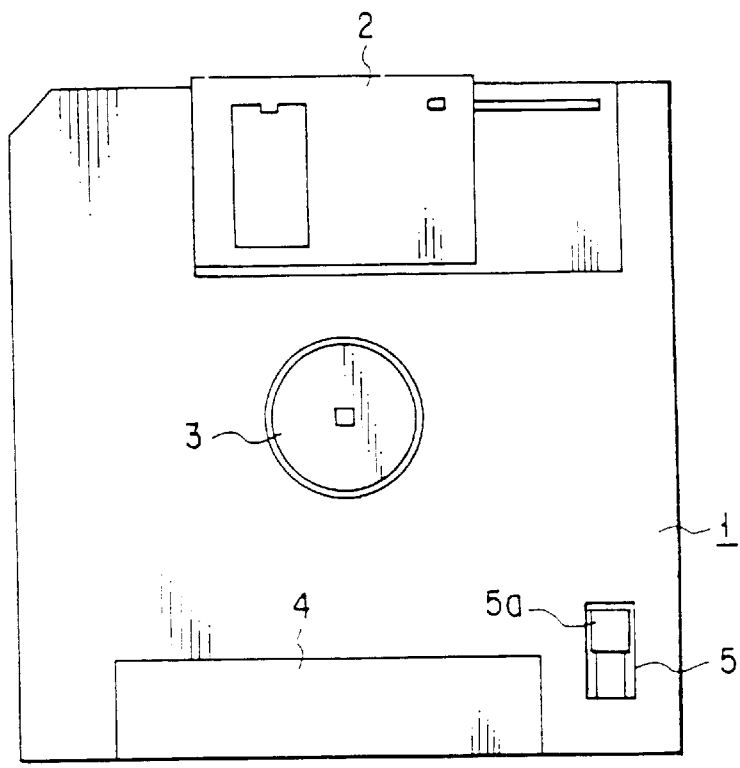
FIGS. 5A and 5B are schematic plan views of a floppy disk, for describing prior art and problems thereof.
Figure 5B:
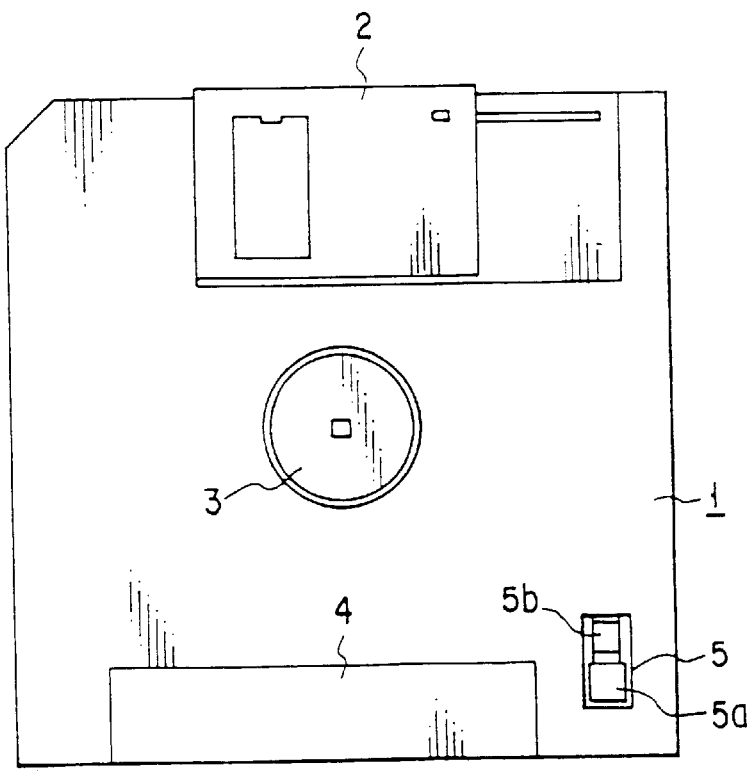

FIGS. 2A to 2C schematically show the structure of the semiconductor memory package 13. FIG. 2A is a perspective view of the sealed surface side of the package 13, FIG. 2B is a perspective view of the terminal surface side of the package, and FIG. 2C is a cross-sectional view taken along line IIC—IIC in FIG. 2A.

The semiconductor memory package 13 is constituted such that a 16 Mbit NAND type flash EEPROM chip 13b functioning as storage medium or non-volatile semiconductor memory device is mounted on a resin-based substrate 13a. Input/output terminals (not shown) of the chip 13b are connected to wiring on a major surface of the substrate 13a by means of bonding wires 13c. The chip 13b, as well as the bonding regions, is resin-sealed by a sealing resin 13d by a one-side transfer mold method.

The wiring on the major surface of the resin-based substrate 13a is exposed to the non-sealed side (bottom side) of the substrate 13a via through-holes and led out as flat external connection terminals 13e.

In the present embodiment, the semiconductor memory package 13 has a size of 16.62 mm×27.59 mm on the terminal surface side, which is less than half the area of the support member 12 in its longitudinal direction.

The memory package 13 is attached to the support member 12 such that the supper surfaces of the external connection terminals 13e are substantially flush with the surface of the support member 12 on which the seal attachment section 15, etc. are formed.

When the memory module 11 having the above structure is used as external storage apparatus such as a floppy disk, a drive apparatus such as a floppy disk drive is needed.

FIG. 3 illustrates a case where the memory module 11 is mounted in a mounting unit of an electronic device such as an information processing device, by using a drive apparatus prepared separately from the electronic device.

For example, when the memory module 11 is used as floppy disk, the memory module 11 is first inserted into a card-shaped holder 21, and the card-shaped holder 21 is then mounted in the mounting unit of the electronic device.

The card holder 21 has a size specified, for example, in PCMCIA (e.g. type 11), has an input/output interface and incorporates a memory controller (not shown) functioning as drive apparatus for writing and reading data.

FIG. 4 schematically shows the structure of a main part of the card-shaped holder 21.

Specifically, the holder 21 has a connector unit 22. A connector pin holder section 23 is provided inside the connector unit 22 in which the memory module 11 is mounted. The connector pin holder section 23 is provided with a plurality of connector pins 24 to be put in contact with the external connection terminals 13e of the semiconductor memory package 13, and connector pins 25 to be put in contact with the seal attachment section on the support member 12. connector pins 24 are connected to the memory controller incorporated in the card-shaped holder 21.

Although FIG. 4 shows only one connector pin 25, the number of connector pins 25 is at least two and the two connector pins 25 are arranged at a distance of 1 mm or more from each other. The connector pins 25 are connected to a discriminating circuit (not shown) provided within the electronic device or card-shaped holder 21. The discriminating circuit discriminates the data write permit state and the data write prohibit state on the basis of the conductive state and non-conductive state between the connector pins 25.

For example, when the conductive seal 16 is not attached to the memory module 11, the connector pins 25 are put in contact with a non-conductive part (seal attachment section 15) on the support member 12. In this case, since the support member 12 has no electrical conductivity, electrical conduction between the connector pins 25 is not effected. Thus, the write permit state is discriminated by the discriminating circuit.

On the other hand, when the conductive seal 16 is attached to the memory module 11, the connector pins 25 are put in contact with the conductive seal 16. Since the conductive seal 16 is electrically conductive, electrical conduction between the connector pins 25 is effected by the conductive seal 16. Thus, the write prohibit state is discriminated by the discriminating circuit.

As has been described above, the memory module 11 is set in the write prohibit state by attaching the conductive seal 16 to the seal attachment section 15 on the support member 12. If the conductive seal 16 is attached, the user can visually recognize the write prohibit state of the memory module 11. In addition, if the memory module 11 is mounted in the card-shaped holder 21, electrical conduction is effected between the connector pins 25 and the memory controller can also recognize the write prohibit state of the module 11.

According to the present embodiment, the write prohibit state can be discriminated on the basis of the change in electrical state, and also the write prohibit state can be visually recognized.

Specifically, when the memory module is set in the write prohibit state, the conductive seal is attached to a predetermined position. Thereby, the write prohibit state is visually indicated and electrically detected. According to this embodiment, therefore, the write prohibit state can fully be recognized and detected with use of a small, thin memory module, as compared to a conventional large, thick memory module in which the write prohibit state is set by making use of the change in shape thereof. In other words, even if the memory module is small and thin, the write prohibit state can be visually recognized and electrically detected.

In the present method in which the write prohibit state is set by attaching the conductive seal, the memory module can easily be restored to the write permit state from the write prohibit state by removing the conductive seal. Therefore, as compared to a conventional method in which a hole is formed in the module, the memory module can be more easily restored from the write prohibit state to the write permit state and the strength of the memory module is not degraded.

In addition, according to the present method in which the data write prohibit state is discriminated on the basis of the presence/absence of the conductive seal, the write prohibit mechanism is realized at lower cost, than in the conventional method in which the write prohibit state is set by making use of the change in shape.

The above embodiment is directed to a case where the write prohibit state is set by attaching the conductive seal to the non-conductive memory module. The present invention, however, is applicable to a case where the write permit state is set by attaching a conductive seal.

In the present method, the conductive state obtained by attaching the conductive seal can be associated with either the write prohibit state or the write permit state, depending on whether the conductive state effected between the connector pins 25 by the attachment of the conductive seal is associated with the write prohibit state or with the write permit state.

Suppose that the attachment of the conductive seal is associated with the write prohibit state. In this case, if defective contact occurs between the conductive seal and the connector pins due to some cause, the write permit state is erroneously recognized and necessary data would be erased.

On the other hand, if the attachment of the conductive seal is associated with the write permit state, the seal needs to be attached prior to the write operation. The frequency of actual use of the memory module in the write permit state is much higher than that in the write prohibit state. Consequently, the seal is worn earlier and the reliability of the detection of the conductive state must be ensured to compensate the earlier wear of the seal.

In the present embodiment, in order to ensure the reliability of the detection of the conductive state, the conductive state effected by the attachment of the conductive seal is associated with the write prohibit state in which the module is used much less frequently. However, the user can properly decide, depending on the purpose of use, etc., whether the conductive state is associated with the write prohibit state or the write permit state.

If an electrically conductive memory module is used, an electrically non-conductive seal may be attached to set the write prohibit state or write permit state.

In the above embodiment, the memory module is inserted in the card-shaped holder and the card-shaped holder containing the module is mounted in the electronic device. However, the memory module may be directly mounted in the mounting unit of the electronic device having the drive apparatus.

The present invention is applicable not only to the memory module but also to various storage mediums such as floppy disks or magnetic tapes.

The conductive or non-conductive seal may be replaced with a conductive or non-conductive coating material such as ink. In this case, too, the same advantage as in the above embodiment can be obtained.

Other modifications can be made without departing from the spirit of the present invention.

As has been described above in detail, according to the present invention, there is provided a small and thin information storage apparatus permitting one to visually recognize the write prohibit state thereof and making it possible to realize a write prohibit mechanism at low cost and an information processing apparatus using this information storage apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An information processing apparatus for use in receiving an information storage device that includes a semiconductor storage medium with a first portion having an external connection terminal and a second portion including a state-designating portion for designating a state in which writing of information to the semiconductor storage medium is prohibited, the information processing apparatus comprising:

an external support member having a cavity therein, at least one side wall of the external support member having an opening for receiving the information storage device;

a plurality of first connector pins, positioned in the cavity, for providing an electrical connection with the information storage device, to retrieve the information from the semiconductor storage medium;

a plurality of second connector pins, positioned in the cavity, for providing a contact with the state-designating portion, a physical position of the plurality of second connector pins with respect to the opening being closer than a physical position of the plurality of first connector pins with respect to the opening; and a discriminating circuit operably coupled to the plurality of second connector pins for discriminating whether writing information to the semiconductor storage medium is prohibited by detecting conductive/non-conductive state between the plurality of connector pins.

2. The information processing apparatus according to claim 1, wherein the plurality of second connector pins comprise at least two electrodes arranged at a distance of at least approximately 1 mm.

3. The information processing apparatus according to claim 2, further comprising a memory controller to control writing and reading data to the semiconductor storage medium.

4. The information processing apparatus according to claim 3, wherein the memory controller is capable of controlling a NAND flash EEPROM as the semiconductor storage medium.

5. The information processing apparatus according to one of claims 2 and 4, wherein a cross section of at least one of the plurality of first connector pins represents a rounded portion and a straight portion.

6. The information processing apparatus according to one of claims 2 and 4, wherein a cross section of at least one of the plurality of second connector pins represents a rounded portion and a straight portion.

7. A connector pin assembly for use in an information processing apparatus for receiving a memory card, the memory card having a state designating portion for designating whether or not writing of information to the memory card is prohibited, the connector pin assembly comprising:

a connector pin supporter;

a plurality of first connector pins, supported by the connector pin supporter, the plurality of first connector pins being adapted to establish contact with a plurality of respective external connection terminals of the memory card; and a plurality of second connector pins, supported by the connector pin supporter, the plurality of second connector pins being adapted to establish contact with the state designating portion.

8. The connector pin assembly according to claim 7, wherein the contact between the plurality of first connector pins and the plurality of respective external connection terminals includes an electrical contact.

9. The connector pin assembly according to claim 7, wherein the contact between the plurality of second connector pins and the state designating portion includes a physical contact.

10. The connector pin assembly according to claim 7, wherein the plurality of second connector pins are at least two electrodes arranged at a distance of at least approximately 1 mm.

11. The connector pin assembly according to claim 10, wherein a cross section of at least one of the plurality of first connector pins represents a rounded portion and a straight portion.

12. The connector pin assembly according to claim 10, wherein a cross section of at least one of the plurality of second connector pins represents a rounded portion and a straight portion.

13. The connector pin assembly according to claim 7, wherein the connector pin supporter have an opening to receive the memory card, and a physical position of the plurality of second connector pins with respect to the opening is closer than a physical position of the plurality of first connector pins with respect to the opening.

* * * * *